United States Patent [19]
Kato et al.

[11] Patent Number: 5,800,725
[45] Date of Patent: Sep. 1, 1998

[54] METHOD OF MANUFACTURING SEMICONDUCTOR WAFERS

[75] Inventors: Tadahiro Kato, Shirakawa; Hisashi Masumura; Hideo Kudo, both of Fukushima-ken, all of Japan

[73] Assignee: Shin-Etsu Handotai Co., Ltd., Tokyo, Japan

[21] Appl. No.: 789,798

[22] Filed: Jan. 28, 1997

[30] Foreign Application Priority Data

Jan. 31, 1996 [JP] Japan ................................ 8-014842
Jan. 21, 1997 [JP] Japan ................................ 9-008169

[51] Int. Cl.⁶ .............................. B44C 1/22; C03C 15/00
[52] U.S. Cl. .................................. 216/88; 216/90; 438/692
[58] Field of Search .................................. 216/88, 90, 99; 438/692, 750

[56] References Cited

U.S. PATENT DOCUMENTS 5,071,776  12/1991  Matsushita et al. ............... 437/10
5,424,224  6/1995  Allen et al. ............... 437/10

FOREIGN PATENT DOCUMENTS 3-211718   9/1991   Japan .
4-124823   4/1992   Japan .
7-045564   2/1995   Japan .
8-316180   11/1996  Japan .

*Primary Examiner*—Nam Nguyen
*Assistant Examiner*—George Goudreau
*Attorney, Agent, or Firm*—Nikaido, Marmelstein, Murray & Oram LLP

[57] ABSTRACT

A method of manufacturing semiconductor wafers includes a double side primary polishing step, a back side etching step and a single side mirror polishing step. This method is capable of easy sensor detection of the front and back sides of the wafer, wafer processing of higher flatness level by forming etched rough surface at the back side of the double side polished wafer and setting up of wafer manufacturing process including a double side polishing step.

13 Claims, 6 Drawing Sheets

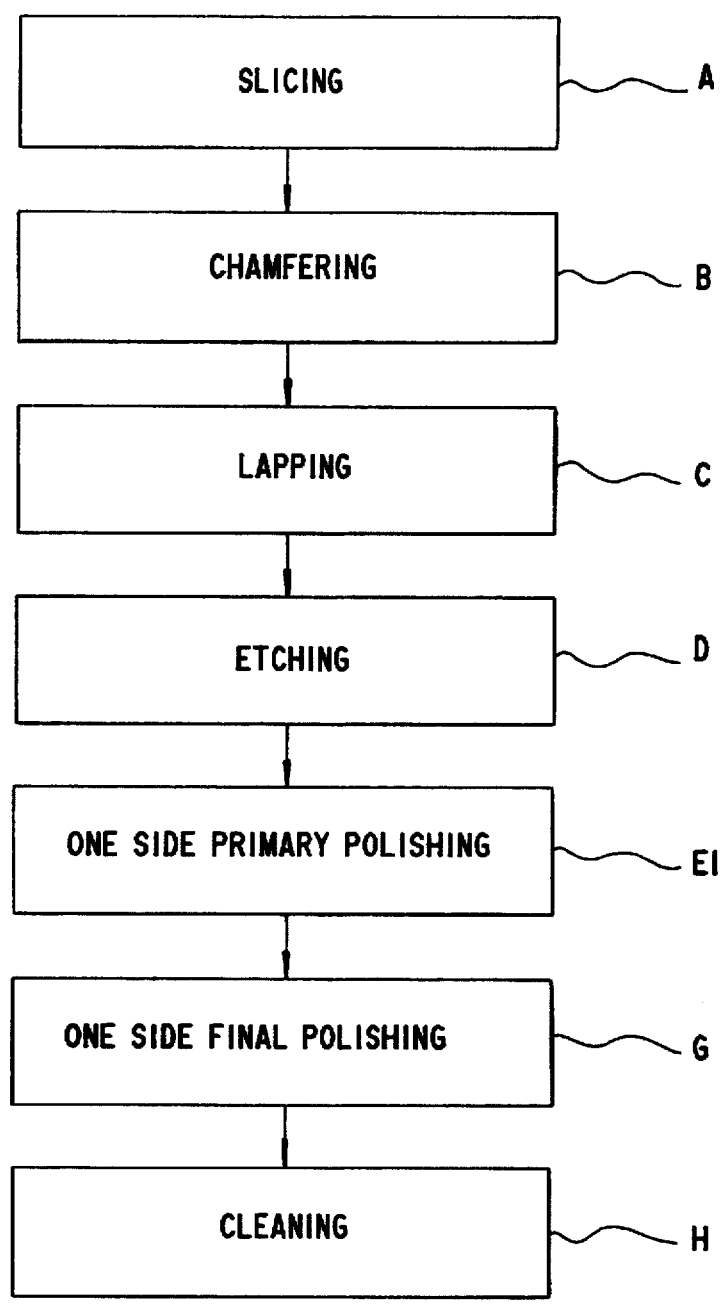

METHOD OF MANUFACTURING SEMICONDUCTOR WAFERS

BACKGROUND OF THE INVENTION

1. Field of the Invention

The present invention relates to a method of manufacturing semiconductor wafers, in particular, single crystal silicon wafers (hereinafter may be referred to, for brevity, as "wafer") which become substrates for fabricating semiconductor devices.

2. Description of the Related Art

Generally, as shown in FIG. 8, the manufacturing method of semiconductor wafers includes a slicing step (A) to obtain wafers of thin disc shape by slicing a single crystal ingot formed by a pulling step using a crystal pulling machine; a chamfering step (B) to chamfer a peripheral edge portion of the wafer obtained through the slicing step (A) to prevent cracking or breakage of the wafer; a lapping step (C) to flatten the surface of the chamfered wafer by lapping it; an etching step (D) to remove processing damage of the so chamfered and lapped wafer; a primary mirror polishing step (E1) to primarily polish one side of the etched wafer to obtain a primary mirror surface of the wafer; a final mirror polishing step (G) to finally polish the side of the so primarily mirror polished wafer to obtain a final mirror surface of the wafer; and a cleaning step (H) for cleaning the finally mirror polished wafer to remove the polishing agent or dust particles from its surface.

In the above-mentioned conventional method of manufacturing wafers, both the primary mirror polishing step and the final mirror polishing step are usually carried out with a single side polishing machine.

A double side polishing machine is known as a wafer polishing machine other than the above-mentioned single side polishing machine. The double side polishing machine is advantageously capable of polishing simultaneously both the front and back sides of a wafer with high flatness level. The double side polishing has great merits in highly precise flatness level and high productivity and hence is favorably for the next system for processing silicon wafers. However, when the double side polishing step with the double side polishing machine is applied in its conventional form to the polishing step in the above-mentioned conventional method, as both the front and back sides become mirror surfaces, respective sensors of processing machine in device fabrication process can not distinguish the front side from the back side and the so mirror polished wafer tends to slip out during handling process.

There have been heretofore proposed many methods which maintain the merits of the double side polishing with the double side polishing machine and obviate the demerits thereof. As one of such methods, there is known a method of polishing wafers comprising the first step for forming a protective film consisting of $SiO_2$ and/or $Si_3N_4$ all over the surface of the front and back sides of a wafer, the second step for forming an exposed wafer surface by grinding the front side of the wafer to remove the protective film of the front side alone, the third step for polishing the exposed wafer surface alone by mechanochemical polishing the wafer with a double side polishing machine, and the fourth step for removing the protective film on the back side by etching (Japanese Patent Laid-Open Publication No. 5-315305). In this method, however, although the merit of the double side polishing machine that the flatness of the polished wafer is improved is maintained, it is indispensable to remove the protective film on the back side by etching so that the process of this method becomes complicated to that extent.

SUMMARY OF THE INVENTION

With the foregoing problems in view, the present inventors have conducted extended researches to realize a novel method of manufacturing semiconductor wafers wherein a double side polishing step is effectively applied to manufacture a polished wafer of high quality with high flatness level and rough surface at the back side. The researches have led to the result that the present invention has been accomplished.

It is an abject of the present invention to provide a novel method of manufacturing semiconductor wafers which is capable of sensor detection of the front and back sides of the wafer and higher flatness level wafer processing.

To achieve the above-mentioned object, a method of manufacturing semiconductor wafers according to the present invention comprises the steps of double side primary polishing of both the front and back sides of a starting wafer, back side etching of the back side alone of the double side polished wafer and single side mirror polishing of the front side of the back side etched wafer.

An etched wafer is used as the starting wafer. The etched wafer is preferably manufactured by a conventional method wherein a chamfered and lapped wafer is subjected to etching treatment to remove processing damage thereof. The single side mirror polishing step preferably includes a secondary mirror polishing step for secondarily polishing the front side of the back side etched wafer and a final mirror polishing step for finally polishing the secondarily polished front side of the wafer.

Acid etching is preferably used for the back side etching. The acid etching advantageously has no problem on the generation of fine dust or particles from the etched surface in comparison with alkaline etching. The acid etching is preferably conducted with an acid etching solution containing hydrofluoric acid, nitric acid, sulfuric acid and water indispensably. This acid etching solution may further contain acetic acid and/or phosphoric acid.

The above and other objects, features and advantages of the present invention will become manifest to those versed in the art upon making reference to the detailed description and the accompanying sheets of drawings.

BRIEF DESCRIPTION OF THE DRAWINGS

FIG. 8 is a flow chart showing one example of conventional manufacturing methods of semiconductor wafers.

DETAILED DESCRIPTION OF THE INVENTION

The present invention will be described below in greater detail by way of the following embodiments shown in FIGS.

Figure 1:
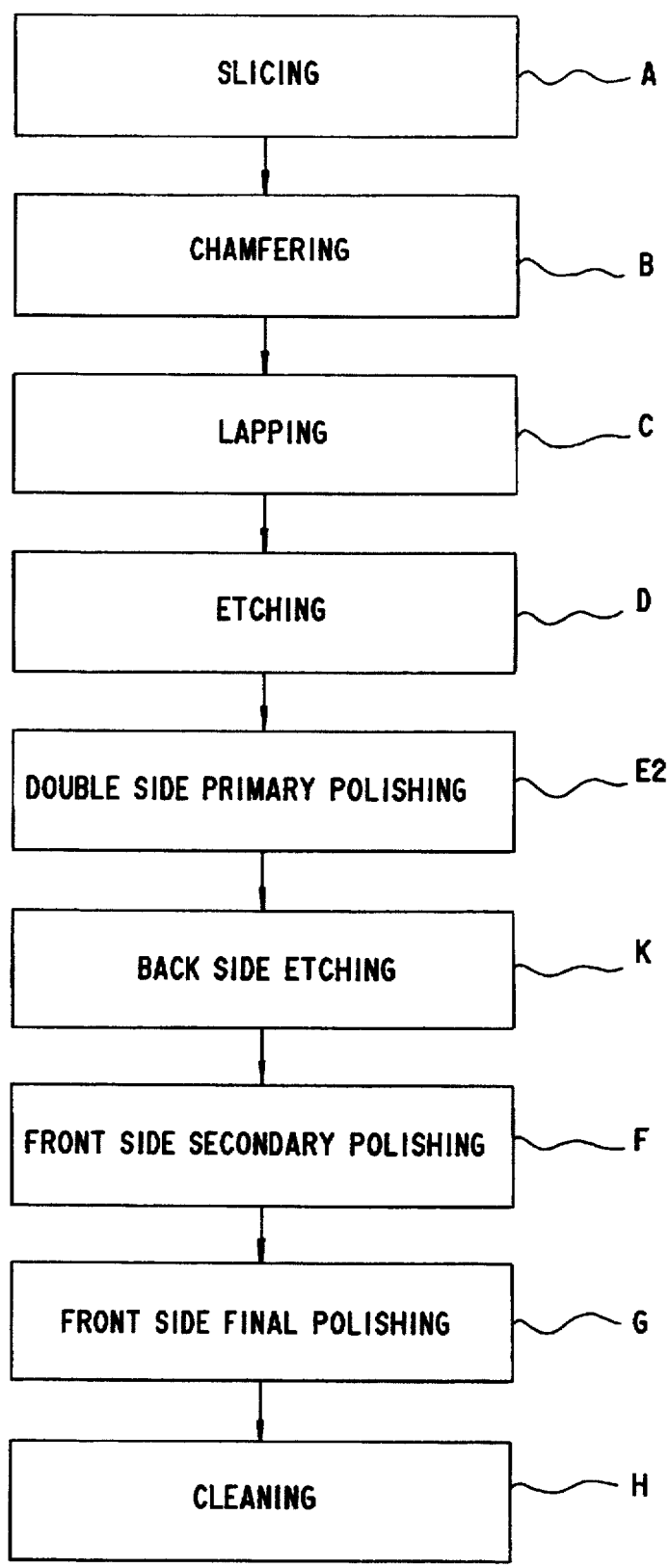
FIG. 1 is a flow chart showing an embodiment of a method of manufacturing semiconductor wafers according to the present invention.

1 through 7 and examples which should be construed as illustrative rather than restrictive. In FIG. 1, these steps which are like or corresponding to those shown in FIG. 8 are designated by the corresponding reference characters.

FIG. 1 is a flow chart showing an embodiment of the present invention. In a slicing step (A), a single crystal ingot formed by a pulling step using a crystal pulling machine (not shown) is sliced at a right angle or predetermined angle to an axial direction thereof to produce a plurality of wafers of thin disc shape. A peripheral edge portion of the wafer obtained through the slicing step (A) is chamfered in a chamfering step (B) to prevent cracking or breakage of the wafer. The chamfered wafer is lapped and flattened by a lapping machine (not shown) in a lapping step (C).

Figure 6:
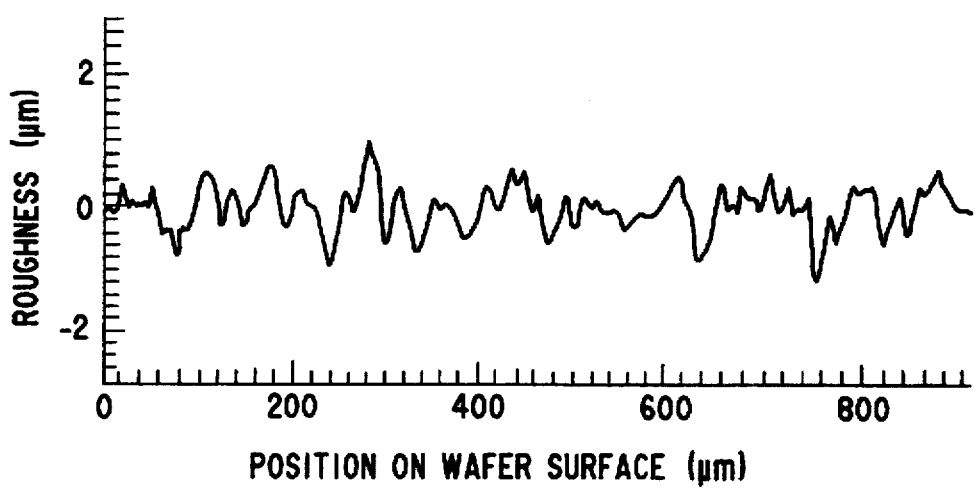
FIG. 6 is a graph showing distribution of the surface roughness of a wafer subjected to alkaline etching.

The lapped and flattened wafer is then subjected to alkaline etching in an etching step (D) using 45% solution of NaOH, for instance, as an alkaline etching solution to remove processing damage thereof. In this alkaline etching step, surface roughness of etched wafer is so large that a cycle of the roughness is in the range of 10 to 20 µm in frequency as shown in FIG. 6 and a P-V value thereof sometimes exceeds 1.5 µm. Fine roughness peculiar to acid etching does not appear on the alkaline etched wafer surface flatness of which is kept a certain excellent extent within the range of the allowance as shown in FIG. 6.

In conventional processes, the front side alone of the etched wafer in which processing damage is removed in the etching step (D) is directly mirror polished in the front side polishing step (F). When the etched wafer is subjected to double side polishing at this stage, as stated above, respective sensors of processing machine can not distinguish the front side from the back side and hence it is impossible to introduce a double side polishing step after the etching step as in the conventional processes.

In one of the embodiments of the present invention, after the etching step (D), the etched wafer is subjected to a double side polishing step (E2) as primary double side polishing thereof. Then, a back side etching step (K) is newly carried out to etch the back side alone of the primarily double side polished wafer. This back side etching is preferably conducted with a mixed acid. The acid etching advantageously has no problem on the generation of fine dust or particles from the etched surface in comparison with the alkaline etching. The mixed acid is composed of an acid etching solution containing hydrofluoric acid, nitric acid, sulfuric acid and water indispensably, when occasion demands, may further contain acetic acid, phosphoric acid or the like. The etching time is enough for about 1 to 3 minutes.

In the back side etching step (K), the back side of the wafer becomes rough surface by the acid etching but the front side thereof maintains mirror surface state formed by the double side primary polishing.

Figure 7:
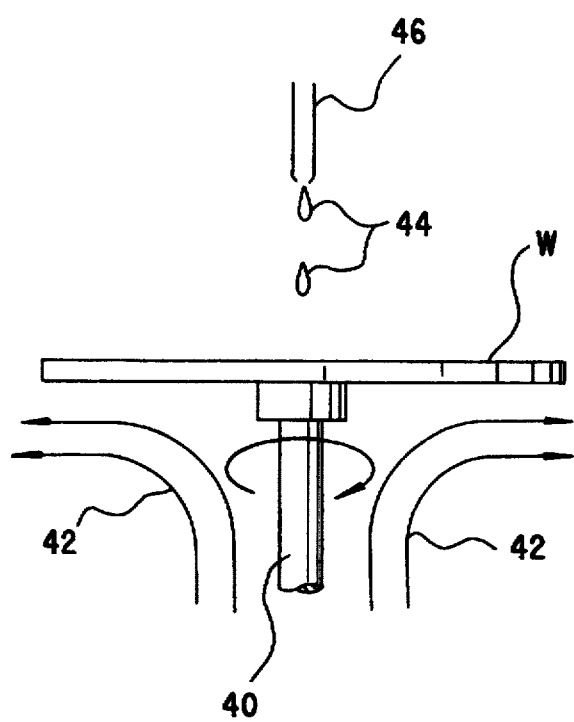
FIG. 7 is an explanatory schematic side view showing one example of single side etching methods.

A single side etching method used in the back side etching step (K) is enough as far as one side of a wafer is etched and does not have any special limitations. For instance, the single side etching method using a single wafer spin etching apparatus as shown in FIG. 7 may be applied thereto. In FIG. 7, a wafer (W) is chucked with a rotatable vacuum chucking means 40 at its one side (under side in FIG. 7). Air 42 is blown up toward the under side of the wafer (W) to prevent an etching solution (etchant) 44 from flowing down around to the under side thereof. While the wafer (W) is rotated, a predetermined amount of etching solution (etchant) 44 is dropped on the central part of the upper side of the wafer (W) from a movable and vibratory etchant supply nozzle 46 provided above the wafer (W) so that the upper side of the wafer (W) is etched for a predetermined time. In this etching treatment, the etchant supply nozzle 46 is preferably moved with vibration toward the central part of the wafer (W). The width of the movement of the etchant supply nozzle may be at most the diameter of the wafer (W), that is ±20~50 mm or so. The etching is terminated by increasing the rotation speed of the wafer (W) as well as supplying a stream of rinse water on the wafer (W) from the etchant supply nozzle 46. The wafer (W) is finally dried up by further increasing the rotation speed of the wafer (W). After completion of the etching treatment, the etched wafer (W) is taken off from the vacuum chucking means 40 with the chucking being off.

In the single side etching method used in the present invention, as stated above, with the single wafer spin etching apparatus of FIG. 7, wafers are subjected to the steps of etching →rinsing →drying under the following conditions or so while the wafers are rotated.

Etching: Rotation speed of wafers=10–100 r.p.m., flux of etchant=2–3 liters/min., etching time=1–3 min.

Rinsing: Rotation speed of wafers=1,000–2,000 r.p.m., flux of rinse water=2–3 liters/min., rinsing time=1 min. or so Drying: Rotation speed of wafers=2,500–3,000 r.p.m., drying time=0.5–1 min.

The above conditions are described as to the case of treatment of a wafer having 150 mm in diameter. These conditions may be changeable with different wafer diameters.

Besides the above single side etching method, another single side etching method using surface coating treatment may be applicable. In this etching method, after an anti-corrosive wax is coated on one side of a wafer with a single side spin coater and dried, the wafer is etched by dipping it into an etching solution (etchant). In order to prevent the generation of uneven etching due to nonuniformity of temperature or so, it is necessary to stir the etching solution (etchant) by circulation and rotate and move the wafer with vibration. The wax coated on the one side of the wafer is effectively removed with warm or hot water or warm or hot alkaline solution (caustic soda+hydrogen peroxide+water). It is not preferable to use an organic solvent for the same purpose. A single side etching treatment may be also similarly conducted by coating an anti-corrosive adhesive film instead of the above noted anti-corrosive wax.

The wafer having the back side roughened by the above back side etching treatment and the front side primarily polished is then subjected to a front side secondary polishing step (F) where the front side of the wafer is secondarily polished with a single side polishing machine as described later and a polishing agent, thereafter a front side final polishing step (G) where the front side of the wafer is finally polished and a cleaning step (H) where the finally polished wafer is cleaned to remove the polishing agent or dust particles from its surface. The flatness level of the wafer obtained in this embodiment is improved with the introduction of the double side polishing treatment. As the back side thereof is used with the etched rough surface being exposed, the brightness thereof is low so that sensor detection of the front side and back side of the wafer on the basis of the brightness difference between both sides thereof becomes possible.

Figure 3:
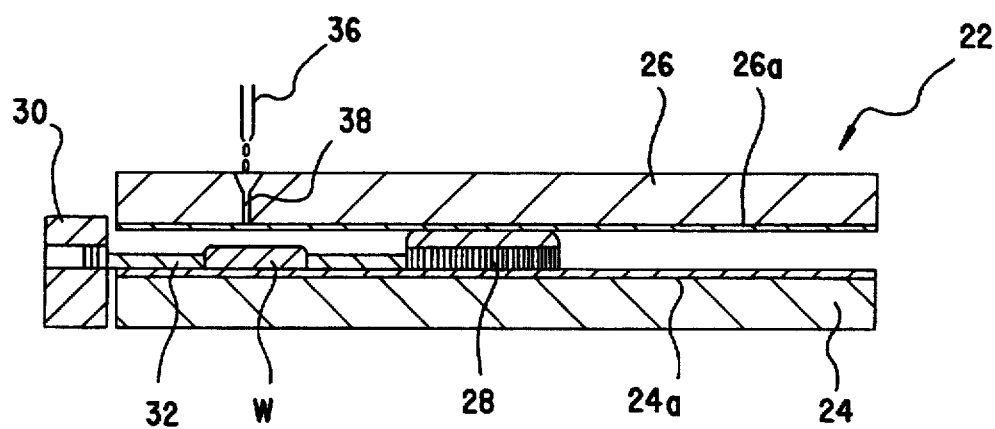
FIG. 3 is a cross sectional schematic view of a double side polishing machine.
Figure 4:
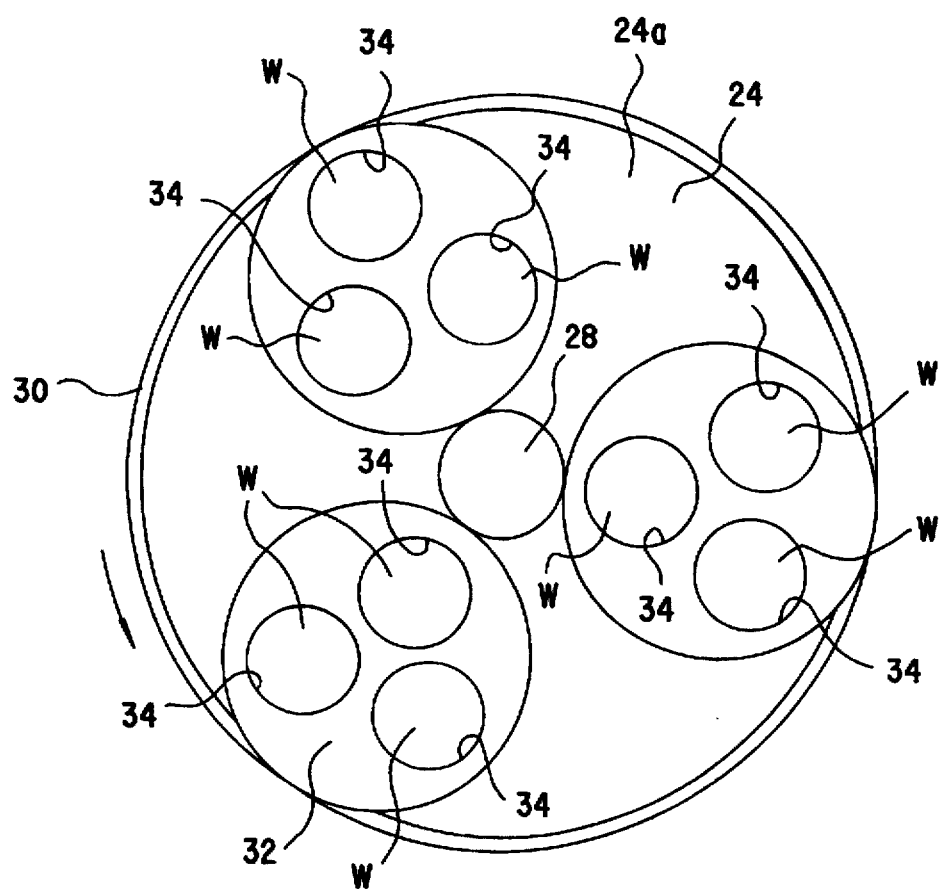
FIG. 4 is a schematic plan view showing the double side polishing machine in which an upper polishing turn table is removed.
Figure 5:
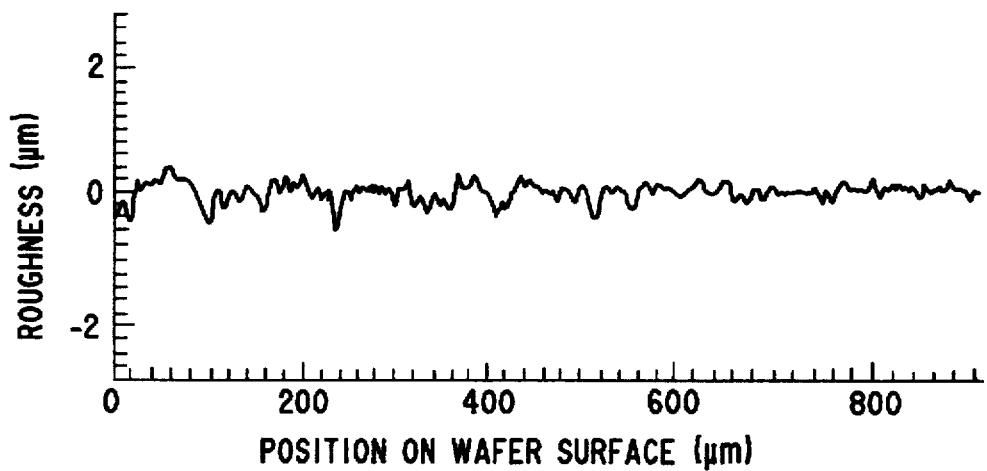
FIG. 5 is a graph showing distribution of the surface roughness of a wafer subjected to acid etching.

FIG. 3 is a cross sectional schematic view of a double side polishing machine used in the above-mentioned double side primary polishing step. FIG. 4 is a schematic plan view showing the double side polishing machine in which an upper polishing turn table is removed. In FIG. 3, the double side polishing machine 22 comprises a lower polishing turn table 24 and an upper polishing turn table 26 which are faced each other vertically. A lower polishing pad 24a is adhered on the upper surface of a lower polishing turn table 24 and an upper polishing pad 26a is adhered on the lower surface of the upper polishing turn table 26. The lower polishing turn table 24 and the upper polishing turn table 26 are rotated oppositely each other by a driving means (not shown). The lower polishing turn table 24 has a central gear 28 which is provided on the upper surface of the central portion thereof and an annular internal gear 30 which is provided in the proximity of the periphery thereof. Both the central gear 28 and the annular internal gear 30 are rotated independently of lower polishing turn table 24.

Reference numeral 32 denotes a carrier of disc shape which is supported between the upper surface of the lower polishing pad 24a of the lower polishing turn table 24 and the lower surface of the upper polishing pad 26a of the upper polishing turn table 26 and rotates and revolves slidably between the lower polishing pad 24a and the upper polishing pad 26a under the action of the central gear 28 and the internal gear 30.

The carrier 32 has a plurality of wafer holes 34. Wafers (W) which are to be polished are set in the wafer holes 34. When the wafers (W) are polished, a polishing agent is supplied to spaces between the wafers (W) and the polishing pads 24a, 26a via hole 38 formed in the upper polishing plate 26 from a nozzle 36. As the carrier 32 rotates and revolves, the wafers (W) rotate and revolve slidably between the lower polishing pad 24a and the upper polishing pad 26a, thereby both the sides of the wafers (W) being polished.

Figure 2:
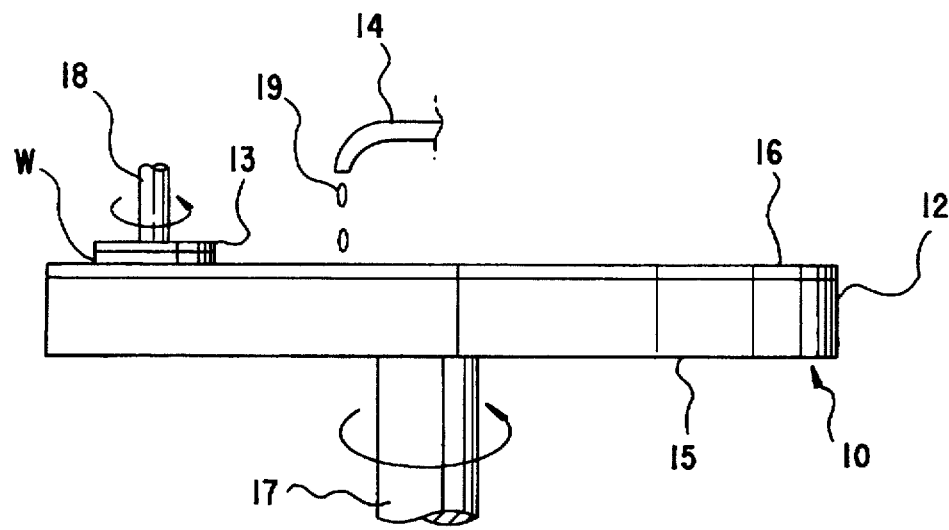
FIG. 2 is a schematic side view showing a single side polishing machine used in the embodiment of the present invention.

FIG. 2 is a side elevation showing a conventional single side polishing machine used in the above-mentioned front side secondary polishing step and front side final polishing step. In FIG. 2, the polishing machine 10 comprises a turn table assembly 12, a wafer holder 13, and a polishing agent supplying member 14. The turn table assembly 12 comprises a turn table 15 and a polishing pad 16 adhered on the upper surface of the turn table 15. The turn table 15 can rotate on a shaft 17 at a predetermined rotation speed by a driving device such as a motor. The wafer holder 13 is for holding with a vacuum chucking means or the like means to carry the wafer (W) on the polishing pad 16 of the turn table assembly 12 so that the surface of the wafer (W) faces to the polishing pad 16. The wafer holder 13 can rotate on a shaft 18 at a predetermined rotation speed and horizontally move on the polishing pad 16 by an appropriate driving device such as a motor. During operation of the polishing machine 10, the wafer (W) held by the wafer holder 13 is in contact with the polishing pad 16 and proper polishing loads are applied to the wafer (W) in a downward direction through the shaft 18 and the wafer holder 13. The polishing agent supplying member 14 is for supplying a polishing agent 19 on the polishing pad 16 to supply it between the wafer (W) and the polishing pad 16.

EXAMPLE 1

Sample wafers: Czochralski-grown p-type, <100>-oriented, 150 mm Φ, silicon wafer The above-mentioned silicon wafers are etched in a usual way and then subjected to double side primary polishing with the double side polishing machine described above. 20 pieces of those double side polished silicon wafers are subjected to back side etching consisting of (① etching→② rinsing→③ drying by the use of the single wafer spin etching apparatus shown in FIG. 7 under the following conditions.

① Etching

Rotation speed of the wafers=50 r.p.m.

Composition of the etchant: hydrofluoric acid+nitric acid+sulfuric acid+water [50% HF:98% $HNO_3$:98% $H_2SO_4$:$H_2O$=1:2.4:1:0.3 (by volume)]

Etching time: 2 minutes at room temperature

Flux of the etchant=2 liters/min.

② Rinsing

Rotation of the wafers=1,500 r.p.m.

Flux of the rinse water=2.5 liters/min.

Rinsing time=1 min.

③ Drying

Rotation speed of the wafers=2,800 r.p.m.

Drying time=1 min.

With the above-mentioned back side etching treatment, the back side of the wafer which was polished to mirror surface by the double side polishing was etched and changed to low brightness surface of brightness ≦80%. Surface roughness of the back side of the wafer was increased from Ra≦0.01 μm before etching to Ra=0.5 to 1 μm after etching. This back side etched wafer was further secondarily front side polished and finally front side polished so that a wafer product capable of sensor detection of the front side and back side and having a high flatness level was obtained.

As stated above, the present invention is capable of easy sensor detection of the front and back sides of the wafer, wafer processing of higher flatness level by forming etched rough surface at the back side of the double side polished wafer, and setting up of wafer manufacturing processes including a double side polishing step.

Obviously, various minor changes and modifications of the present invention are possible in the light of the above teaching. It is therefore to be understood that within the scope of the appended claims the invention may be practiced otherwise than as specifically described.

What is claimed is:

1. A method of manufacturing semiconductor wafers which comprises the steps of:
   (a) double side primary polishing of both the front and back sides of a starting wafer;
   (b) back side etching of the back side alone of the double side polished wafer; and
   (c) single side mirror polishing of the front side of the back side etched wafer.

2. A method of manufacturing semiconductor wafers according to claim 1, wherein an etched wafer which was subjected to etching treatment to remove processing damage is used as the starting wafer.

3. A method of manufacturing semiconductor wafers according to claim 1, wherein the single side mirror polishing step includes a single side secondary mirror polishing step and a single side final mirror polishing step.

4. A method of manufacturing semiconductor wafers according to claim 2, wherein the single side mirror polishing step includes a single side secondary mirror polishing step and a single side final mirror polishing step.

5. A method of manufacturing semiconductor wafers according to claim 1, wherein an acid etching step is used for the back side etching step.

6. A method of manufacturing semiconductor wafers according to claim 2, wherein an acid etching step is used for the back side etching step.

7. A method of manufacturing semiconductor wafers according to claim 3, wherein an acid etching step is used for the back side etching step.

8. A method of manufacturing semiconductor wafers according to claim 5, wherein the acid etching step is conducted with an acid etching solution containing hydrofluoric acid, nitric acid, sulfuric acid and water indispensably.

9. A method of manufacturing semiconductor wafers according to claim 6, wherein the acid etching step is conducted with an acid etching solution containing hydrofluoric acid, nitric acid, sulfuric acid and water indispensably.

10. A method of manufacturing semiconductor wafers according to claim 7, wherein the acid etching step is conducted with an acid etching solution containing hydrofluoric acid, nitric acid, sulfuric acid and water indispensably.

11. A method of manufacturing semiconductor wafers according to claim 8, wherein the acid etching solution further contains acetic acid and/or phosphoric acid.

12. A method of manufacturing semiconductor wafers according to claim 9, wherein the acid etching solution further contains acetic acid and/or phosphoric acid.

13. A method of manufacturing semiconductor wafers according to claim 10, wherein the acid etching solution further contains acetic acid and/or phosphoric acid.

* * * * *